United States Patent
Mita et al.

(10) Patent No.: US 10,254,643 B2
(45) Date of Patent: Apr. 9, 2019

(54) IMPRINT APPARATUS AND METHOD OF MANUFACTURING ARTICLE

(71) Applicant: CANON KABUSHIKI KAISHA, Tokyo (JP)

(72) Inventors: Yutaka Mita, Utsunomiya (JP); Tsuyoshi Arai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 19 days.

(21) Appl. No.: 15/011,791

(22) Filed: Feb. 1, 2016

(65) Prior Publication Data

US 2016/0221230 A1 Aug. 4, 2016

(30) Foreign Application Priority Data

Feb. 3, 2015 (JP) ................................. 2015-019613
Nov. 10, 2015 (JP) ................................. 2015-220705

(51) Int. Cl.
   *G03F 7/00* (2006.01)
   *B29C 64/20* (2017.01)
   (Continued)

(52) U.S. Cl.
   CPC .......... *G03F 7/0002* (2013.01); *B29C 64/112* (2017.08); *B29C 64/20* (2017.08);
   (Continued)

(58) Field of Classification Search
   CPC . G03F 7/0002; B29C 2059/023; B29C 64/00; B29C 64/112; B29C 64/20;
   (Continued)

(56) References Cited

U.S. PATENT DOCUMENTS

2011/0151124 A1* 6/2011 Ina .................... B82Y 10/00
                                                        427/277
2011/0266705 A1* 11/2011 Ito ....................... B29C 33/62
                                                         264/39
(Continued)

FOREIGN PATENT DOCUMENTS

| JP | 2011129802 A | 6/2011 |
| JP | 2012015324 A | 1/2012 |
| JP | 2012121175 A | 6/2012 |

*Primary Examiner* — Robert C Dye
*Assistant Examiner* — Sedef E Paquette
(74) *Attorney, Agent, or Firm* — Rossi, Kimms & McDowell LLP

(57) ABSTRACT

The present invention provides an imprint apparatus which forms a pattern on an imprint material on a shot region on a substrate by using a mold, the apparatus comprising a supply unit having a plurality of discharge outlets each of which is configured to discharge the imprint material, and configured to supply the imprint material to the substrate, and a control unit configured to control the supply unit so as to supply the imprint material from the plurality of discharge outlets onto the shot region, wherein the control unit determines discharge outlets to be used to supply the imprint material to the shot region among the plurality of discharge outlets based on discharge history information indicating a history of discharge of the imprint material from each of the plurality of discharge outlets.

15 Claims, 6 Drawing Sheets

(51) Int. Cl.
*B29C 64/112* (2017.01)
*B29C 59/02* (2006.01)
*B29C 64/209* (2017.01)
*B29C 64/386* (2017.01)
*B29C 64/393* (2017.01)

(52) U.S. Cl.
CPC .......... *B29C 64/209* (2017.08); *B29C 64/386* (2017.08); *B29C 64/393* (2017.08); *B29C 2059/023* (2013.01)

(58) Field of Classification Search
CPC ... B29C 64/209; B29C 64/386; B29C 64/393; B33Y 30/00; B33Y 50/00; B33Y 50/02
USPC ........................................................ 264/40.1
See application file for complete search history.

(56) References Cited

U.S. PATENT DOCUMENTS

2013/0113863 A1* 5/2013 Kodama ................ B82Y 10/00
347/68
2013/0120485 A1 5/2013 Kodama et al.

* cited by examiner

F I G. 3A
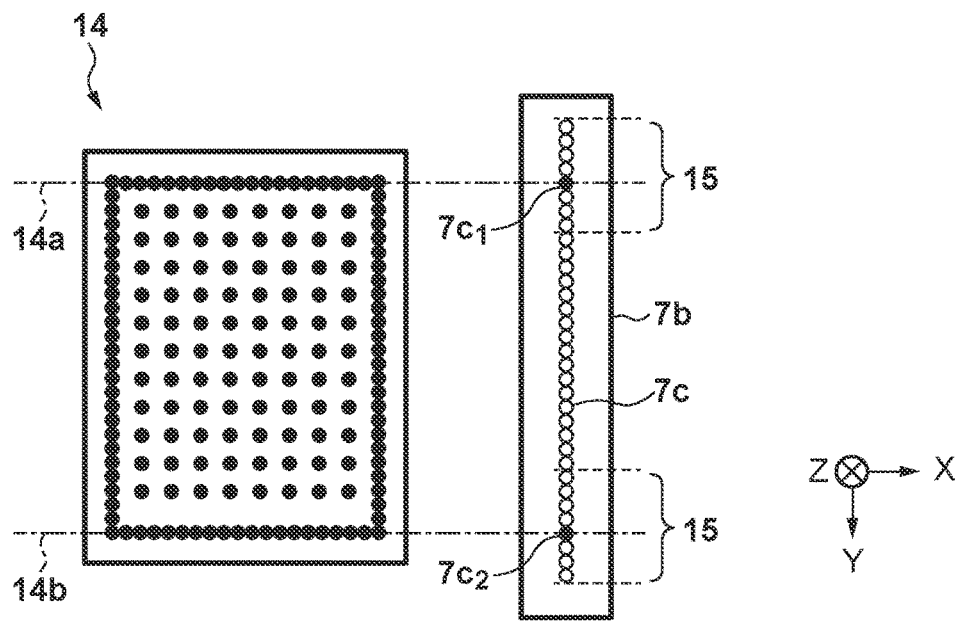
F I G. 3B
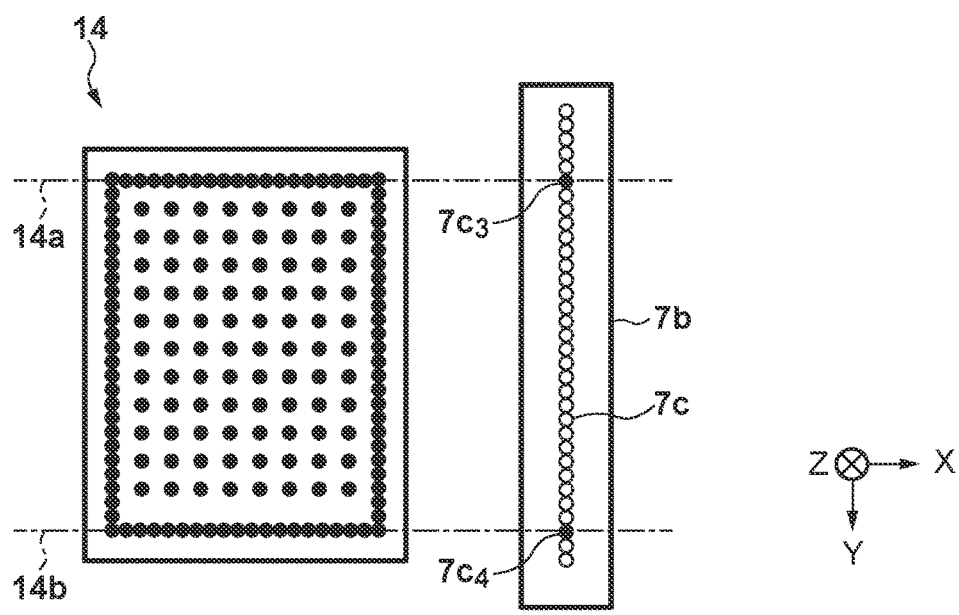

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus which forms a pattern on an imprint material on a substrate by using a mold has attracted attention as one of mass production lithography apparatuses for semiconductor devices and the like. The imprint apparatus includes a dispenser (supply unit) having a plurality of discharge outlets (nozzles) each of which discharges an imprint material to a substrate, and performs supply processing of supplying an imprint material onto the substrate by controlling the discharge of the imprint material from each discharge outlet. Japanese Patent Laid-Open No. 2011-129802 has proposed a method of switching between a plurality of discharge outlets to be used for the supply of an imprint material in accordance with a period in which no imprint material is discharged from each discharge port, in order to prevent clogging in each discharge outlet after a long period of time during which no imprint material is discharged.

It is possible to set, for each discharge outlet, the maximum number of times that an imprint material can be discharged. In this case, when the cumulative number of times of the discharge of an imprint material from any of the plurality of discharge outlets reaches the maximum number of times, the dispenser can be exchanged. In order to reduce the running cost of the imprint apparatus, it is preferable to control the bias of the cumulative numbers of times at the plurality of discharge outlets and reduce the exchange frequency of dispensers. However, as in the method disclosed in Japanese Patent Laid-Open No. 2011-129802, only switching between discharge outlets in accordance with a period in which no imprint material is discharged from each discharge outlet may allow the use of even a discharge outlet exhibiting a large cumulative number of times if no imprint material is discharged from it for a long period of time. This makes it impossible to control the bias of the cumulative numbers of times at a plurality of discharge outlets. This, in turn, may lead to an insufficient reduction in the exchange frequency of dispensers.

SUMMARY OF THE INVENTION

The present invention provides an imprint apparatus advantageous in reducing the exchange frequency of supply units which supply an imprint material.

According to one aspect of the present invention, there is provided an imprint apparatus which forms a pattern on an imprint material on a shot region on a substrate by using a mold, the apparatus comprising: a supply unit having a plurality of discharge outlets each of which is configured to discharge the imprint material, and configured to supply the imprint material to the substrate; and a control unit configured to control the supply unit so as to supply the imprint material from the plurality of discharge outlets onto the shot region, wherein the control unit determines discharge outlets to be used to supply the imprint material to the shot region among the plurality of discharge outlets based on discharge history information indicating a history of discharge of the imprint material from each of the plurality of discharge outlets.

Further features of the present invention will become apparent from the following description of exemplary embodiments with reference to the attached drawings.

BRIEF DESCRIPTION OF THE DRAWINGS

FIG. 3A is a view showing the relationship between the arrangement pattern of an imprint material to be supplied to a shot region and a plurality of nozzles;

FIG. 3B is a view showing the relationship between the arrangement pattern of an imprint material to be supplied to a shot region and a plurality of nozzles;

DESCRIPTION OF THE EMBODIMENTS

Figure 1:
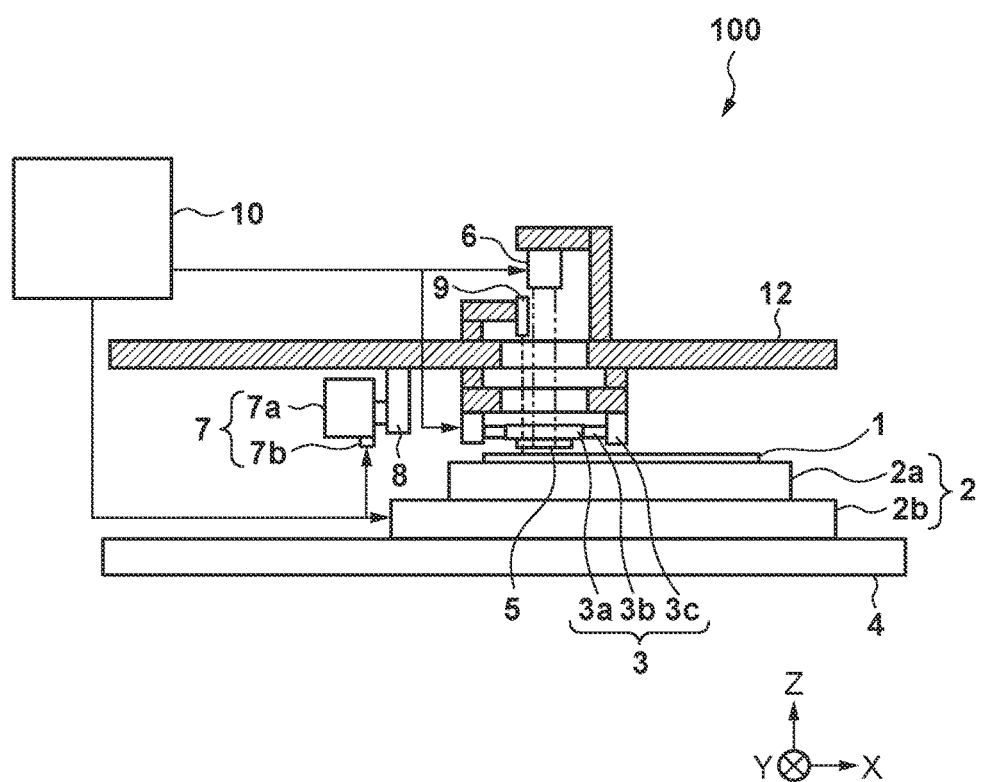
FIG. 1 is a schematic view showing the arrangement of an imprint apparatus.

Exemplary embodiments of the present invention will be described below with reference to the accompanying drawings. Note that the same reference numerals denote the same members throughout the drawings, and a repetitive description thereof will not be given.

<First Embodiment>

An imprint apparatus 100 according to the first embodiment of the present invention will be described. The imprint apparatus 100 is used for the manufacture of semiconductor devices and the like, and performs an imprint process of coating a substrate 1 with an imprint material 13 and molding the imprint material 13 on a substrate by using a mold 5. For example, the imprint apparatus 100 cures the imprint material 13 (resin) while the mold 5 is in contact with the imprint material 13 on the substrate. The imprint apparatus 100 then can form a pattern formed from the imprint material 13 on the substrate by increasing the spacing between the mold 5 and the substrate 1 and separating (releasing) the mold 5 from the cured imprint material 13. Methods of curing the imprint material 13 include a heat cycle method using heat and a photo-curing method using light. The first embodiment will exemplify a case using the photo-curing method. The photo-curing method is a method of curing an uncured ultraviolet curable resin as the imprint material 13 by supplying the resin onto a substrate and irradiating the imprint material 13 with ultraviolet light while the mold 5 is in contact with the imprint material 13.

FIG. 1 is a schematic view showing the arrangement of the imprint apparatus 100. The imprint apparatus 100 can include a substrate stage 2, an imprint head 3, an irradiation unit 6, a supply unit 7, a measuring unit 9, and a control unit 10. The substrate stage 2 is configured to be movable on a base surface plate 4. The imprint head 3 is supported on a bridge surface plate 12 supported on the base surface plate 4 through linear supports (not shown). The control unit 10 includes, for example, a CPU and a memory and controls each unit of the imprint apparatus 100 (controls an imprint process).

The mold 5 is generally prepared by using a material which can transmit ultraviolet light, such as quartz, and a concave-convex pattern for molding the imprint material 13 on the substrate is formed on a partial region (pattern region) on the surface located on the substrate side. In addition, as the substrate 1, for example, a single-crystal silicon substrate or glass substrate is used. The supply unit 7 supplies the imprint material 13 onto the upper surface (treatment surface) of the substrate 1.

The imprint head 3 can include a mold holding unit 3a which holds the mold 5 with, for example, a vacuum suction force or electrostatic force and a mold driving unit 3c which drives the hold holding unit 3a in the Z direction through a support member 3b. The imprint head 3 may include not only a function of driving the mold 5 in the Z direction but also an adjustment function of adjusting the position of the mold 5 in the X and Y directions and the θdirection (a rotating direction around the Z-axis) and a tilt function for correcting the tilt of the mold 5. In addition, the substrate stage 2 includes a substrate chuck 2a which holds the substrate 1 with, for example, a vacuum suction force or electrostatic force and a substrate driving unit 2b configured to mechanically hold the substrate chuck 2a and be movable on the base surface plate 4, and aligns the substrate 1 in the X and Y directions. The substrate stage 2 may include not only a function of moving the substrate 1 in the X and Y directions but also a function which moves the substrate 1 in the Z direction and an adjustment function of adjusting the position of the substrate 1 in the θdirection. In this case, the imprint apparatus 100 according to the first embodiment causes the imprint head 3 to perform the operation of changing the distance (in the Z direction) between the mold 5 and the substrate 1. However, this is not exhaustive. The substrate stage 2 may perform this operation or both of them may relatively perform the operation.

The irradiation unit 6 cures the imprint material 13 on the substrate by irradiating the imprint material 13 with light (ultraviolet light). The irradiation unit 6 can include a light source which emits light which cures the imprint material 13 and an optical element for adjusting light emitted from the light source into light suitable for an imprint process. In this case, since the first embodiment adopts a photo-curing method, the irradiation unit 6 includes a light source which emits ultraviolet light. If, however, the embodiment uses a heat cycle method, a heat source for curing a thermosetting resin as the imprint material 13 can be provided in place of a light source. The measuring unit 9 detects the positional shift between an alignment mark provided on the mold 5 and an alignment mark provided on the substrate 1, and measures the relative positions of a pattern region of the mold 5 and a shot region on a substrate onto which a pattern on the mold 5 is to be transferred.

Figure 2A:
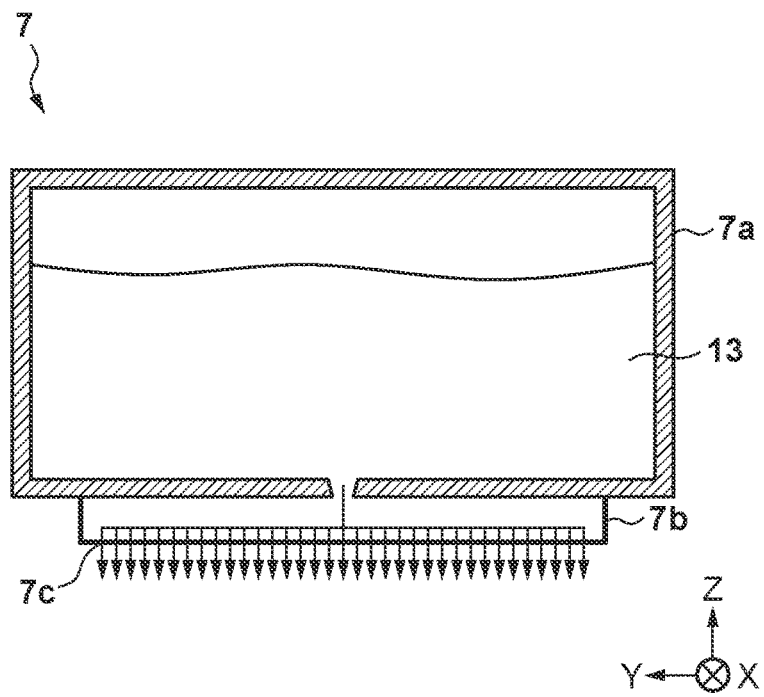
FIG. 2A is a view showing the arrangement of a supply unit.
Figure 2B:
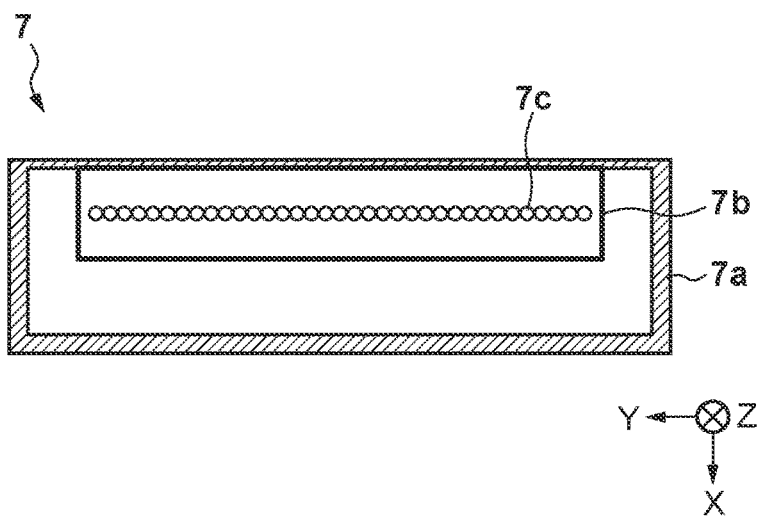
FIG. 2B is a view showing the arrangement of the supply unit.

As shown in FIGS. 2A and 2B, for example, the supply unit 7 includes a tank 7a which contains the imprint material 13 and a dispenser 7b having a plurality of nozzles 7c (discharge outlets) which discharge the imprint material 13 contained in the tank 7a to the substrate 1. As a method of supplying the imprint material 13 onto a substrate, there is available, for example, a method of discharging the imprint material 13 in the form of droplets from each nozzle 7c while the substrate 1 and the supply unit 7 are relatively moving. FIG. 2A is a sectional view of the supply unit 7. FIG. 2B is a view when the supply unit 7 is seen from the −Z direction. The plurality of nozzles 7c are arranged along, for example, a direction (for example, the Y direction) different from a direction (for example, the X direction) in which the supply unit 7 and the substrate 1 are relatively moved when supplying the imprint material 13 onto the substrate. Each of the plurality of nozzles 7c is provided with a control element (for example, a piezoelectric element) for controlling the discharge of the imprint material 13. When a signal (for example, a pulse signal) is supplied to each control element, the control element pushes the imprint material 13 out of the corresponding nozzle 7c, and can discharge a predetermined amount of imprint material 13 (droplets) from the nozzle 7c. Each control element can be configured to control the amount (discharge amount) of imprint material 13 discharged from the corresponding nozzle in accordance with the value of a supplied signal.

The processing (supply processing) of supplying the imprint material 13 to a shot region on a substrate by the supply unit 7 will be described below with reference to FIG. 3A. FIG. 3A shows the relationship between an arrangement pattern 14 of the imprint material 13 to be supplied to a shot region and a plurality of nozzles 7c. As shown in FIG. 3A, the supply unit 7 is configured to supply the imprint material 13 to a shot region by using some of the plurality of nozzles 7c. The control unit 10 then causes each nozzle 7c to discharge the imprint material 13 by supplying a signal to the control element provided for each nozzle 7c in accordance with the arrangement pattern 14 while relatively moving the supply unit 7 and the substrate 1. This makes it possible to supply the imprint material 13 onto the shot region according to, for example, the arrangement defined by the arrangement pattern 14. It is possible to determine the arrangement pattern 14 so as to set the residual layer thickness of the imprint material 13 to a target layer thickness after the formation of a concave-convex pattern by the mold 5, based on, for example, the pattern information of the mold 5 and the ideal discharge amount of imprint material 13 from each nozzle 7c. The RLT (Residual Layer Thickness) of the imprint material 13 is the thickness of the imprint material 13 between the base of a concave portion of the concave-convex pattern formed from the imprint material 13 and the substrate 1.

In the imprint apparatus 100 having the above arrangement, it is possible to determine the maximum number of times that each nozzle 7c can discharge the imprint material 13. In this case, when the cumulative number of times of the discharge of the imprint material 13 from any of the plurality of nozzles 7c reaches the maximum number of times, the dispenser 7b (supply unit 7) can be exchanged. In order to reduce the running cost of the imprint apparatus 100, it is preferable to control the bias of the cumulative numbers of times at the plurality of nozzles and reduce the exchange frequency of dispensers 7b. For this reason, the imprint apparatus 100 according to the first embodiment determines the nozzles 7c to be used for supplying the imprint material 13 to a shot region based on discharge history information indicating the history of the discharge of the imprint material 13 from each of the plurality of nozzles 7c. For example, the control unit 10 counts the cumulative number of times of the discharge of the imprint material 13 from each of the plurality of nozzles 7c in the supply unit 7, and manages information indicating the cumulate numbers of times as discharge history information. The control unit 10 then determines the nozzles 7c to be used for supplying the imprint material 13 to a shot region so as to preferentially use nozzles, of the plurality of nozzles 7c, which exhibit small cumulative numbers of times, based on information indicating the cumulative number of times concerning each of the plurality of nozzles 7c.

In this case, the control unit 10 may manage the cumulative numbers of times of all the nozzles 7c in the supply unit 7 or the specific nozzles 7c exhibiting relatively large numbers of times of the discharge of the imprint material 13. The specific nozzles 7c are, for example, the nozzles 7c which can take charge of imprint material lines 14a and 14b of the arrangement pattern 14 shown in FIG. 3A. Of the nozzles 7c provided in the supply unit 7, the nozzles 7c belonging to ranges 15 can correspond to such nozzles. In the first embodiment, the control unit 10 manages the cumulative number of times of each nozzle 7c. However, an external computer of the imprint apparatus 100 may manage it. In this case, the control unit 10 acquires information indicating cumulative numbers of times from the external computer.

Figure 4:
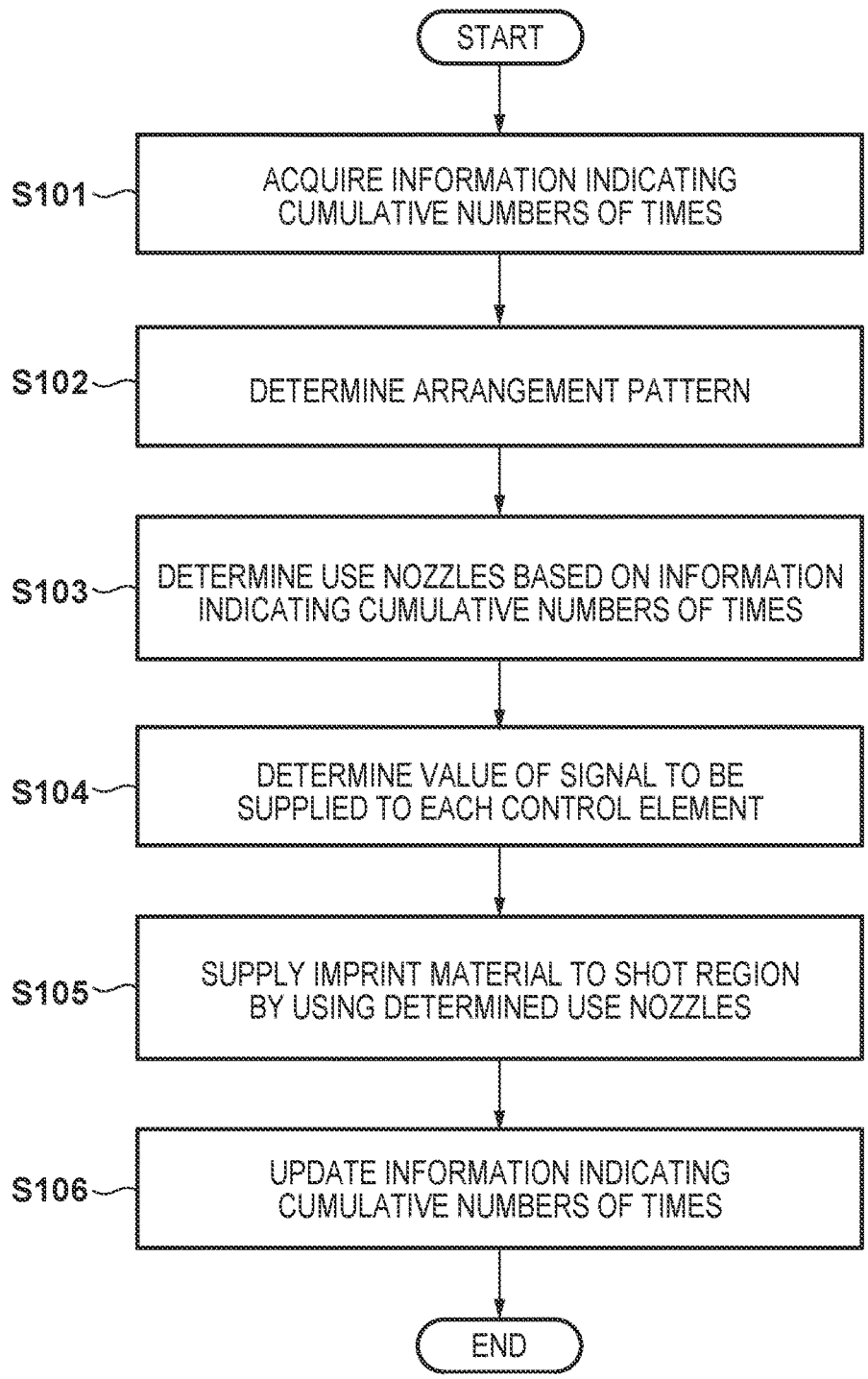
FIG. 4 is a flowchart showing a procedure for supply processing in an imprint apparatus according to the first embodiment.

The processing (supply processing) of supplying the imprint material 13 onto a shot region based on information indicating the cumulative number of times of the discharge of the imprint material 13 from each nozzle 7c will be described next with reference to FIG. 4. FIG. 4 is a flowchart showing a procedure for supplying processing in the imprint apparatus 100 according to the first embodiment. In step S101, the control unit 10 acquires information indicating the cumulative numbers of times concerning the plurality of nozzles 7c. In addition, the control unit 10 may acquire, in addition to the information indicating the cumulative numbers of times, information indicating the elapsed time since the last discharge of the imprint material 13 from each nozzle 7c, information indicating the type of the imprint material 13, information indicating the ideal discharge amount of imprint material 13 from each nozzle 7c, and the like. In step S102, the control unit 10 determines the arrangement pattern 14 of the imprint material 13 to be supplied onto the shot region. For example, the control unit 10 can determine the arrangement pattern 14 so as to set the residual layer thickness of the imprint material 13 to a target layer thickness based on the pattern information of the mold 5 and the ideal discharge amount of imprint material 13 from each nozzle 7c. At this time, the control unit 10 may determine the arrangement pattern 14 further based on a target speed of filling the pattern of the mold 5 with the imprint material 13 in the step of bringing the mold 5 into contact with the imprint material 13.

In step S103, the control unit 10 determines the nozzles 7c to be used (to be referred to as the use nozzles hereinafter) for supplying the imprint material 13 onto the shot region so as to preferentially use the nozzles 7c exhibiting small cumulative numbers of times based on the information indicating the cumulative numbers of times acquired in step S101. If, for example, the nozzles 7c are arranged in a line, the control unit 10 may determine the range of use nozzles (use discharge outlets) so as to preferentially use nozzles exhibiting small cumulative numbers of times. The step of determining use nozzles in this manner can be performed for each shot region or each substrate. Assume that the step of determining use nozzles is performed for each shot region. In this case, for example, for a given shot region, as shown in FIG. 3A, the nozzles 7c belonging to the range from a nozzle $7c_1$ to a nozzle $7c_2$ are determined as use nozzles. For another shot region, as shown in FIG. 3B, the nozzles 7c belonging to the range from a nozzle $7c_3$ to a nozzle $7c_4$ are determined as use nozzles. This makes it possible to control the bias of the cumulative numbers of times at the plurality of nozzles 7c and reduce the exchange frequency of dispensers 7b (supply units 7). In this case, the control unit 10 may determine use nozzles further based on information indicating the elapsed times acquired in step S101 so as to preferentially use the nozzles 7c exhibiting long elapsed times since the last discharges of the imprint material 13. This makes it possible to prevent clogging in each nozzle 7c by reducing volatile components of the imprint material 13.

In step S104, in order to set the discharge amount of imprint material 13 from each use nozzle to a target discharge amount (ideal discharge amount), the control unit 10 determines the value of a signal to be supplied to the corresponding control element in accordance with the cumulative number of times. Assume that a piezoelectric element is provided as a control element for each nozzle 7c. In this case, if a signal having a predetermined value is only supplied to each control element, the discharge amount of imprint material 13 from the corresponding nozzle 7c can change in accordance with the cumulative number of times. For this reason, the control unit 10 has acquired, in advance by experiments or the like, the relationship between the cumulative numbers of times and the discharge amounts of imprint material 13 from the nozzles 7c when signals having predetermined values are supplied to the control elements. The control unit 10 then determines the value of a signal to be supplied to each control element by using the relationship in accordance with the cumulative number of times that the corresponding nozzle 7c has discharged the imprint material 13. Supplying the signal whose value has been determined in this manner to each control element can bring the discharge amount of imprint material 13 from the nozzle 7c corresponding to the control element close to a target discharge amount.

In step S105, the control unit 10 changes the relative positional relationship between the supply unit 7 and the shot region in accordance with the position of the use nozzle determined in step S103 in the supply unit 7 (dispenser 7b) by, for example, controlling the substrate stage 2. The control unit 10 then causes the supply unit 7 to supply the imprint material 13 to the shot region according to the arrangement pattern 14 determined in step S102 by using the use nozzles determined in step S103. At this time, the control unit 10 counts the cumulative number of times of the discharge of the imprint material 13 from each nozzle 7c of the supply unit 7. The user preferably recognizes the cumulative number of times counted by the control unit 10 in this manner. For this purpose, the imprint apparatus 100 is preferably provided with, for example, a display unit which displays the cumulative number of times counted by the control unit 10. In step S106, the control unit 10 updates information indicating the cumulative number of times with the cumulative number of times from each nozzle counted in step S105. The information indicating the cumulative number of times updated in this manner can be used when next supplying the imprint material 13 onto a shot region.

As described above, the imprint apparatus 100 according to the first embodiment determines use nozzles so as to preferentially use nozzles, of the plurality of nozzles 7c, which exhibit small cumulative numbers of times based on information indicating the cumulative number of times concerning each of the plurality of nozzles 7c. This makes it possible to control the bias of the cumulative numbers of times at the plurality of nozzles 7c and reduce the exchange frequency of dispensers 7b (supply units 7).

<Second Embodiment>

An imprint apparatus according to the second embodiment of the present invention will be described. The imprint apparatus 100 according to the first embodiment determines the arrangement pattern 14 of an imprint material to be supplied onto a shot region and then determines use nozzles so as to preferentially use the nozzles 7c, of the plurality of nozzles 7c, which exhibit small cumulative numbers of times. In contrast to this, the imprint apparatus according to the second embodiment determines use nozzles and then determines an arrangement pattern 14 so as to preferentially use nozzles 7c, of the use nozzles, which exhibit small cumulative numbers of times. Since the imprint apparatus according to the second embodiment has the same apparatus arrangement as that of the imprint apparatus 100 according to the first embodiment, a description of the apparatus arrangement will be omitted.

Figure 5:
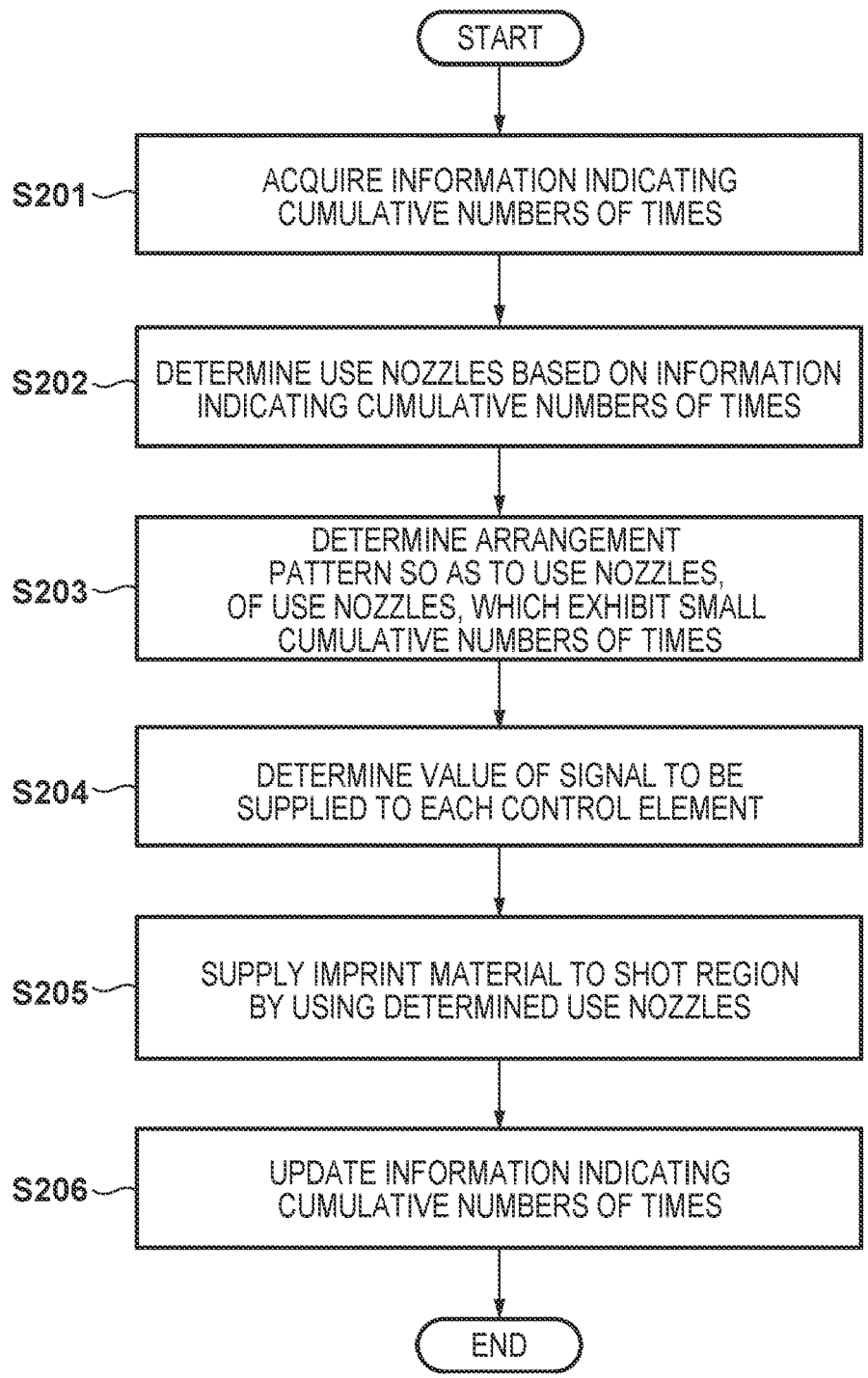
FIG. 5 is a flowchart showing a procedure for supply processing in an imprint apparatus according to the second embodiment.

The processing of supplying an imprint material 13 onto a shot region in the imprint apparatus according to the second embodiment will be described with reference to FIG. 5. FIG. 5 is a flowchart showing a procedure for supply processing in the imprint apparatus according to the second embodiment. Since steps S204 to S206 in the flowchart of FIG. 5 are the same as steps S104 to S106 in the flowchart of FIG. 4 described in the first embodiment, a description of them will be omitted.

In step S201, a control unit 10 acquires information indicating the cumulative numbers of times concerning a plurality of nozzles 7c. In the second embodiment, it is preferable to acquire information indicating cumulative numbers of times concerning all the nozzles 7c in a supply unit 7. In addition, the control unit 10 may acquire, in addition to the information indicating the cumulative numbers of times, information indicating the elapsed time since the last discharge of the imprint material 13 from each nozzle 7c, information indicating the type of the imprint material 13, information indicating the ideal discharge amount of imprint material 13 from each nozzle 7c, and the like. In step S202, the control unit 10 determines use nozzles so as to preferentially use the nozzles 7c exhibiting small cumulative numbers of times based on the information indicating the cumulative numbers of times acquired in step S201. In this case, the control unit 10 may determine use nozzles so as to preferentially use the nozzles 7c corresponding to long elapsed times since the last discharges of the imprint material 13 based on the information indicating the elapsed times acquired in step S201.

In step S203, the control unit 10 determines the arrangement pattern 14 of the imprint material 13 to be supplied to the shot region so as to set the residual layer thickness of the imprint material to a target layer thickness. The control unit 10 may determine the arrangement of the imprint material 13 to be supplied to the shot region based on the height of the pattern of the imprint material 13 in place of the residual layer thickness of the imprint material. At this time, the control unit 10 may determine the arrangement pattern 14 so as to preferentially use the nozzles 7c, of the use nozzles determined in step S202, which exhibit small cumulative numbers of times. Assume that the use nozzles determined in step S202 include the first and second nozzles adjacent to each other, and the number of times of discharge from the first nozzle is larger than that from the second nozzle. In this case, the control unit 10 determines the arrangement pattern 14 so as to make the number of times of the discharge of the imprint material 13 from the second nozzle larger than that from the first nozzle when supplying the imprint material onto the shot region by substituting discharge from the second nozzle for discharge from the first nozzle. In step S203, the control unit 10 may select the arrangement pattern 14 to be used for supply processing from a plurality of types of arrangement patterns 14 so as to preferentially use the nozzles 7c, of the use nozzles, which exhibit small cumulative numbers of times. The control unit 10 or an external computer can generate in advance a plurality of types of arrangement patterns 14, based on, for example, the pattern information of the mold 5 and the ideal discharge amount of imprint material 13 from each nozzle 7c, so as to set the residual layer thickness of the imprint material to a target layer thickness.

As described above, the imprint apparatus according to the second embodiment determines the arrangement pattern 14, after use nozzles are determined, so as to preferentially use the nozzles 7c, of the use nozzles, which exhibit small cumulative numbers of times. This makes it possible to further suppress an increase in the exchange frequency of dispensers 7b (supply units 7) as compared with the imprint apparatus according to the first embodiment.

<Third Embodiment>

Figure 6:
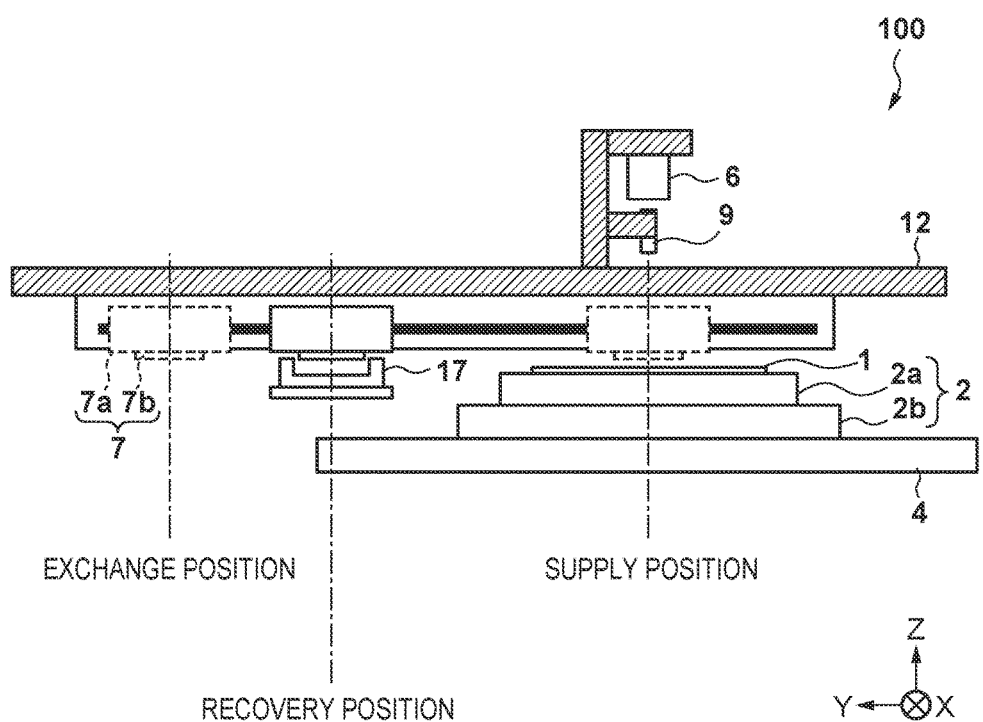
FIG. 6 is a view when the imprint apparatus is seen from the −X direction.

For example, the discharge amount of an imprint material 13 from a nozzle 7c of a dispenser 7b of a supply unit 7 sometimes deviates from a target discharge amount or the adhesion position of the imprint material on a substrate sometimes deviates from a target position. For this reason, an imprint apparatus 100 can perform processing (recovery processing) for recovering a trouble in the nozzle 7c. For example, as shown in FIG. 6, the imprint apparatus 100 can be provided with a driving unit 8 which drives the supply unit 7 between a supply position at which supply processing is performed, a recovery position at which recovery processing is performed, and an exchange position at which the supply unit 7 (dispenser 7b) is exchanged. FIG. 6 is a view when the imprint apparatus 100 is seen from the –X direction. When a trouble occurs in the nozzle 7c, a control unit 10 controls the driving unit 8 to arrange the supply unit 7 at the recovery position, and controls the supply unit 7 to discharge the imprint material 13 from the nozzle 7c to a vessel 17 until recovery from a trouble in the nozzle 7c. At this time, the control unit 10 counts the cumulative number of times of the discharge of the imprint material 13 from each nozzle 7c, and updates the information indicating the cumulative number of times based on the counted cumulative number of times concerning each nozzle 7c. As described above, counting the cumulative number of times during the execution of processing for recovery from a trouble in the nozzle 7c allows the supply unit 7 to accurately supply the imprint material 13.

<Fourth Embodiment>

The first embodiment has exemplified the case in which information indicating the cumulative number of times concerning each nozzle 7c is acquired as discharge history information, and use nozzles are determined to preferentially use the nozzles 7c, of the plurality of nozzles 7c, which exhibit small numbers of times of discharge. In contrast, an imprint apparatus according to the fourth embodiment will be described by exemplifying a case in which information of a driving voltage applied to each nozzle 7c and the cumulative time of application is acquired as discharge history information, and use nozzles are determined based on the acquired information.

When a piezoelectric element is provided as each control element for causing the corresponding nozzle 7c to discharge an imprint material, a characteristic degradation can occur in the piezoelectric layer of the control element in accordance with the driving voltage applied to the control element and the cumulative time during which the driving voltage is applied. For this reason, the relationship of the driving voltage applied to the control element for each nozzle 7c and the cumulative time with the characteristic degradation of the piezoelectric layer is acquired in advance by experiments and the like. A control unit 10 then preferably acquires, as discharge history information, information indicating the driving voltage applied to the control element of each nozzle and the cumulative time, and determines use nozzles so as to preferentially use the nozzles 7c exhibiting small characteristic degradations of the control elements based on the acquired information. This makes it possible to control the bias of the characteristic degradations of the plurality of nozzles 7c and reduce the exchange frequency of dispensers 7b (supply units 7).

<Fifth Embodiment>

In recovery processing in the third embodiment, when the nozzles 7c discharge the imprint material 13, the imprint material 13 can remain on a surface (discharge surface) on which the plurality of nozzles 7c are arranged. The discharge surface is coated with a water repellent agent or the like to stabilize the discharge of the imprint material 13. When the imprint material 13 remains near a specific nozzle, removal processing is performed to prevent the drop of the imprint material 13. If removal processing is performed by bringing a member which adsorbs an imprint material into contact with the discharge surface or wiping the discharge surface with a wiper or the like, water-repellency continuousness can degrade, and the discharge of the imprint material 13 can become unstable. For this reason, the relationship between the number of times of removal processing for a residual imprint material and the characteristic degradation of each nozzle 7c (discharge surface) is acquired in advance by experiments or the like. The control unit 10 preferably acquires, as discharge history information, information indicating the number of times of removal processing for a residual imprint material and determines use nozzles so as to preferentially use the nozzles 7c exhibiting small characteristic degradations based on the acquired information.

<Embodiment of Method of Manufacturing Article>

A method of manufacturing an article according to an embodiment of the present invention is suitable for manufacturing an article such as a microdevice such as a semiconductor device or an element having a microstructure. This method of manufacturing an article according to this embodiment includes a step of forming a pattern on a resin applied on a substrate by using the above imprint apparatus (a step of performing an imprint process on the substrate) and a step of processing the substrate on which the pattern has been formed in the preceding step. The manufacturing method further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

<Other Embodiments>

Embodiment(s) of the present invention (the control unit) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-019613, filed Feb. 3, 2015 and 2015-220705, filed Nov. 10, 2015, which are hereby incorporated by reference herein in their entirety.

What is claimed is:

1. An imprint apparatus which forms a pattern of an imprint material on a shot region on a substrate by using a mold, the apparatus comprising:

a supply device having a plurality of discharge outlets each of which is configured to discharge the imprint material as a droplet, and configured to supply the imprint material to the substrate; and a controller configured to control the supply device so as to supply the imprint material from the plurality of discharge outlets onto the shot region, wherein each of the plurality of discharge outlets is provided with a control element configured to control an amount of the imprint material to be discharged as a droplet in accordance with a supplied signal value such that a target amount of the imprint material is discharged in response to the supplied signal value having a first value, and wherein the controller:

selects discharge outlets to be used to supply the imprint material to the shot region among the plurality of discharge outlets, based on discharge history information indicating a cumulative number of times the imprint material has been discharged as droplets for each of the plurality of discharge outlets, so as to preferentially use discharge outlets that have a smaller cumulative number of times as compared to other discharge outlets among the plurality of discharge outlets, and adjusts, in accordance the cumulative number of times in the discharge history information, a signal value to be supplied to the control element for each of the selected discharge outlets so as to maintain an amount of the imprint material to be discharged as a droplet at the target amount, the adjusted signal value having a different signal value than the first value.

2. The apparatus according to claim 1, wherein the controller selects discharge outlets to be used to supply the imprint material to the shot region, for each shot region or each substrate, based on the discharge history information.

3. The apparatus according to claim 1, wherein the controller determines an arrangement pattern of the imprint material to be supplied to the shot region so as to preferentially use discharge outlets that have a smaller cumulative number of times as compared to other discharge outlets among the selected discharge outlets.

4. The apparatus according to claim 1, wherein the controller selects an arrangement pattern of the imprint material to be supplied to the shot region, from a plurality of types of arrangement patterns, so as to preferentially use discharge outlets that have a smaller cumulative number of times as compared to other discharge outlets among the selected discharge outlets.

5. The apparatus according to claim 1, wherein the controller determines a magnitude of the adjusted signal value to be supplied to the control element according to a relationship between the cumulative number of times and discharge amounts of the imprint material when signals having predetermined signal values are supplied to the control element.

6. The apparatus according to claim 1, wherein the controller counts the cumulative number of times for each of the plurality of discharge outlets.

7. The apparatus according to claim 6, further comprising a display device configured to display the cumulative number of times counted by the controller.

8. An imprint apparatus which forms a pattern of an imprint material on a shot region on a substrate by using a mold, the apparatus comprising:
a supply device having a plurality of discharge outlets each of which is configured to discharge the imprint material as a droplet, and configured to supply the imprint material to the substrate; and
a controller configured to control the supply device so as to supply the imprint material from the plurality of discharge outlets onto the shot region,
wherein each of the plurality of discharge outlets is provided with a control element configured to control an amount of the imprint material to be discharged as a droplet in accordance with a supplied signal value, and
wherein the controller:
estimates a characteristic degradation of the control element for each of the plurality of discharge outlets, based on information indicating a driving voltage that has been applied to each discharge outlet and a cumulative time of application of the driving voltage, and
selects discharge outlets to be used to supply the imprint material to the shot region among the plurality of discharge outlets, so as to preferentially use discharge outlets that have a smaller estimated characteristic degradation as compared to other discharge outlets.

9. The apparatus according to claim 1, wherein the controller changes a relative positional relationship between the supply device and the shot region while the imprint material is supplied onto the shot region in accordance with respective positions of discharge outlets to be used to supply the imprint material onto the shot region in the supply device.

10. An imprint apparatus which forms a pattern of an imprint material on a shot region on a substrate by using a mold, the apparatus comprising:
a supply device having a plurality of discharge outlets each of which is configured to discharge the imprint material as droplets; and
a controller configured to control the supply device, so as to discharge the imprint material as droplets from the plurality of discharge outlets and supply the imprint material onto the shot region,
wherein a discharge amount of the imprint material to be discharged as a droplet from each discharge outlet changes in accordance with a cumulative number of times the imprint material has been discharged as droplets, and
wherein the controller is configured to control the supply device based on information indicating the cumulative number of times for each discharge outlet, so that the discharge amount for each discharge outlet is brought close to a target amount.

11. The apparatus according to claim 10, wherein
each of the plurality of discharge outlets is provided with a control element configured to control the discharge amount of the imprint material as a droplet in accordance with a supplied signal, and
the controller is configured to control a signal to be supplied to the control element, based on the information indicating the cumulative number of times.

12. The apparatus according to claim 11, wherein the controller is configured to control the signal to be supplied to the control element, further based on information indicating a relationship between the cumulative number of times and the discharge amount of the imprint material as a droplet from each discharge outlet when a predetermined signal is supplied to the control element.

13. The apparatus according to claim 10, wherein the controller is configured to change discharge outlets to be used for supplying the imprint material onto the shot region, among the plurality of discharge outlets, based on the information indicating the cumulative number of times.

14. The apparatus according to claim 10, wherein the controller is configured to determine discharge outlets to be used for supplying the imprint material, among the plurality of discharge outlets, for each shot region or each substrate.

15. The apparatus according to claim 10, wherein the controller is configured to determine a range of discharge outlets to be used for supplying the imprint material, among the plurality of discharge outlets, based on the information indicating the cumulative number of times.

* * * * *